(12) United States Patent
Ishii

(10) Patent No.: US 6,744,224 B2
(45) Date of Patent: Jun. 1, 2004

(54) RUSH CURRENT LIMITING CIRCUIT FOR A PFM CONTROL CHARGE PUMP

(75) Inventor: Toshiki Ishii, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/358,837

(22) Filed: Feb. 5, 2003

(65) Prior Publication Data
US 2003/0151423 A1 Aug. 14, 2003

(30) Foreign Application Priority Data
Feb. 6, 2002 (JP) .......................... 2002-029345

(51) Int. Cl.$^7$ ................................. G05F 1/00
(52) U.S. Cl. .................. 315/291; 315/219; 327/536; 327/540; 323/282
(58) Field of Search .................. 315/219, 247, 315/224, 209 R, DIG. 7, 291; 327/536, 538, 540; 323/282, 284, 285; 363/59, 60

(56) References Cited

U.S. PATENT DOCUMENTS 5,642,073 A * 6/1997 Manning ..................... 327/536
5,677,645 A * 10/1997 Merritt ........................ 327/536
6,107,862 A * 8/2000 Mukainakano et al. ...... 327/536

* cited by examiner

Primary Examiner—Haissa Philogene
(74) Attorney, Agent, or Firm—Adams & Wilks

(57) ABSTRACT

An input voltage detecting circuit for detecting an input voltage is provided inside a PFM control charge pump circuit, and potential differences between potentials appearing at gate terminals and potentials appearing at source terminals are reduced by gate voltage controlling circuits for in response to a signal from the input voltage detecting circuit, suppressing gate voltages of switch transistors of a charge pump to suppress a rush current value to thereby reduce a current to prevent generation of a noise.

4 Claims, 3 Drawing Sheets

RUSH CURRENT LIMITING CIRCUIT FOR A PFM CONTROL CHARGE PUMP

BACKGROUND OF THE INVENTION

1. Field of the Invention

The present invention relates to a rush current limitation and noise reduction circuit for a charge pump for limiting a rush current in a PFM (Pulse Frequency Modulation) control charge pump circuit and for reducing a noise.

2. Description of the Related Art

Up to now, in a PFM control charge pump circuit shown in FIG. 2, upon activation of a power supply or activation of the operation (ON-time) of the charge pump circuit, a large rush current is caused to flow into a pump capacitor or an output capacitor from an input power supply. In addition, in the case of the PFM control, even in the normal oscillation cycle, the change in input voltage increases a peak current during the operation so that the GND potential varies, which becomes the source of generation of a noise.

However, in the conventional PFM control charge pump circuit, a large rush current is caused to flow upon activation of a power supply. Here, a charge pump circuit 15' includes driver circuit 5 for supplying the electric charges to a pump capacitor 4 and an output capacitor 3, respectively, driver circuit 9 for driving the driver circuit 57 respectively, and a PFM control circuit 6. In addition, since even during the normal operation, the change in input voltage causes a large current to flow, such a large current causes the voltage drop of an input power supply and becomes the source of generation of a noise. As a result, there is a possibility that other circuits connected to the same input power supply as that of the charge pump circuit undergoes malfunction.

SUMMARY OF THE INVENTION

In the light of the foregoing, the present invention has been made in order to solve the above-mentioned problems associated with the prior art, and it is therefore an object of the present invention to provide a rush current limitation and noise reduction circuit for a PFM control charge pump which is capable of suppressing generation of a rush current and a noise to prevent other circuits connected to the same input power supply as that of a PFM control charge pump circuit from undergoing malfunction.

In order to solve the above-mentioned problems, according to the present invention, there is provided a voltage detecting circuit for detecting an input voltage inside a PPM control charge pump circuit, in which potential differences between potentials appearing at gate terminals and potentials appearing at source terminals are reduced by, in response to a signal from the input voltage detecting circuit, suppressing gate voltages of switch transistors of a charge pump to suppress a rush current value to thereby reduce a current to prevent generation of a noise.

According to the present invention, a voltage detecting circuit for detecting an input voltage is provided inside a PFM control charge pump circuit, and also in response to a signal from the input voltage detecting circuit, a gate voltage of a switch transistor in the charge pump circuit is suppressed. As a result, even if the input voltage varies, a rush current is held to a minimum to suppress a current to thereby suppress generation of a noise. Consequently, there is also removed a possibility that other circuits connected to the same input power supply as that of the charge pump circuit undergo malfunction.

BRIEF DESCRIPTION OF THE DRAWINGS

The foregoing and other objects are effected by the invention as will be apparent from the following description and claims taken in connection with the accompanying drawings, forming a part of this application, in which:

DESCRIPTION OF THE PREFERRED EMBODIMENTS

Figure 1:
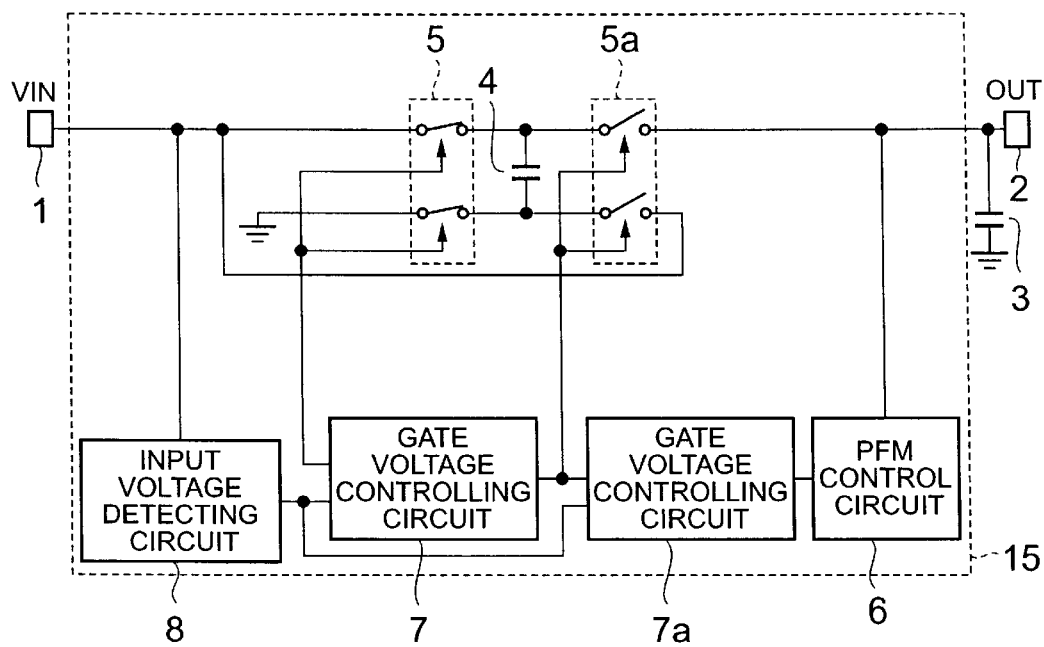
FIG. 1 is a circuit diagram, partly in block diagram, showing a configuration of a rush current limitation and noise reduction circuit for a PFM control charge pump according to an embodiment of the present invention.
Figure 2:
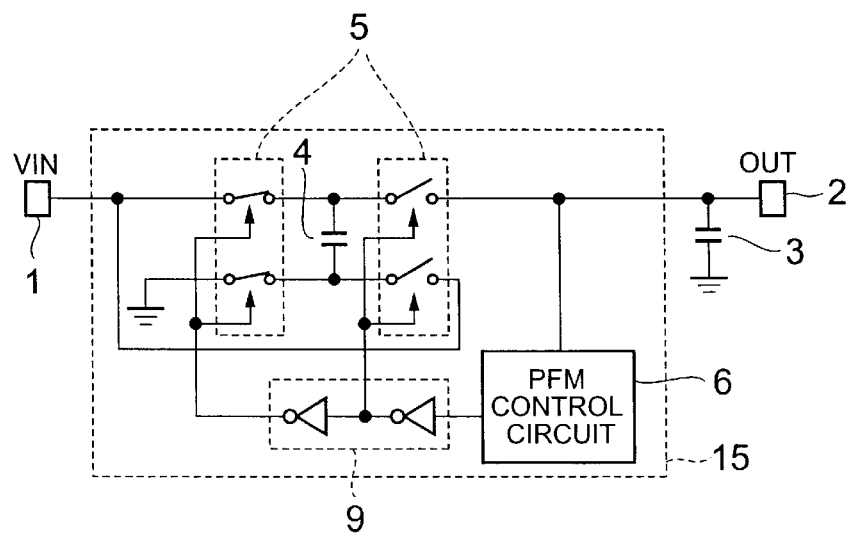
FIG. 2 is a circuit diagram, partly in block diagram, showing a configuration of a conventional charge pump circuit.

The preferred embodiments of a rush current limitation and noise reduction circuit for a PFM control charge pump of the present invention will hereinafter be described in detail with reference to the accompanying drawings. FIG. 1 is a circuit diagram, partly in block diagram, showing a configuration of a rush current limitation and noise reduction circuit for a PFM control charge pump according to an embodiment of the present invention. Here, a charge pump circuit 15 includes driver circuits 5 and 5a for supplying the electric charges to a pump capacitor 4 and an output capacitor 3, respectively, gate voltage controlling circuits 7 and 7a for driving the driver circuits 5 and 5a, respectively, a PFM control circuit 6, and an input voltage detecting circuit 8.

Next, the operation of the rush current limitation and noise reduction circuit for a PFM control charge pump of the present embodiment will hereinbelow be described in detail with reference to FIG. 1. Upon activation of the charge pump circuit provided by application of a high voltage to a power supply terminal 1, an input voltage is detected by the input voltage detecting circuit 8, and the detected input signal is then sent to each of the gate voltage controlling circuits 7 and 7a. As a result, the adjustment is carried out so that the potential differences between the potentials appearing at gate terminals of switches of the respective driver circuits 5 and 5a and the potentials appearing at source terminals on the power supply terminal 1 side and the GND terminal side of the respective switches become small, respectively. As a result, even if a high power supply voltage is applied to the power supply terminal 1, a large rush current is prevented from being caused to flow into the pump capacitor 4 or the output capacitor 3 and hence there is removed a possibility that other circuits undergo malfunction due to drop of the power supply voltage or generation of a noise.

In addition, even during the normal operation, the currents caused to flow through the driver circuits 5 and 5a are limited, whereby even when a high power supply voltage is applied, a large rush current is prevented from being caused to flow into the pump capacitor 4 or the output capacitor 3 and hence there is removed a possibility that other circuits undergo malfunction due to drop of the power supply voltage or generation of a noise.

Figure 3:
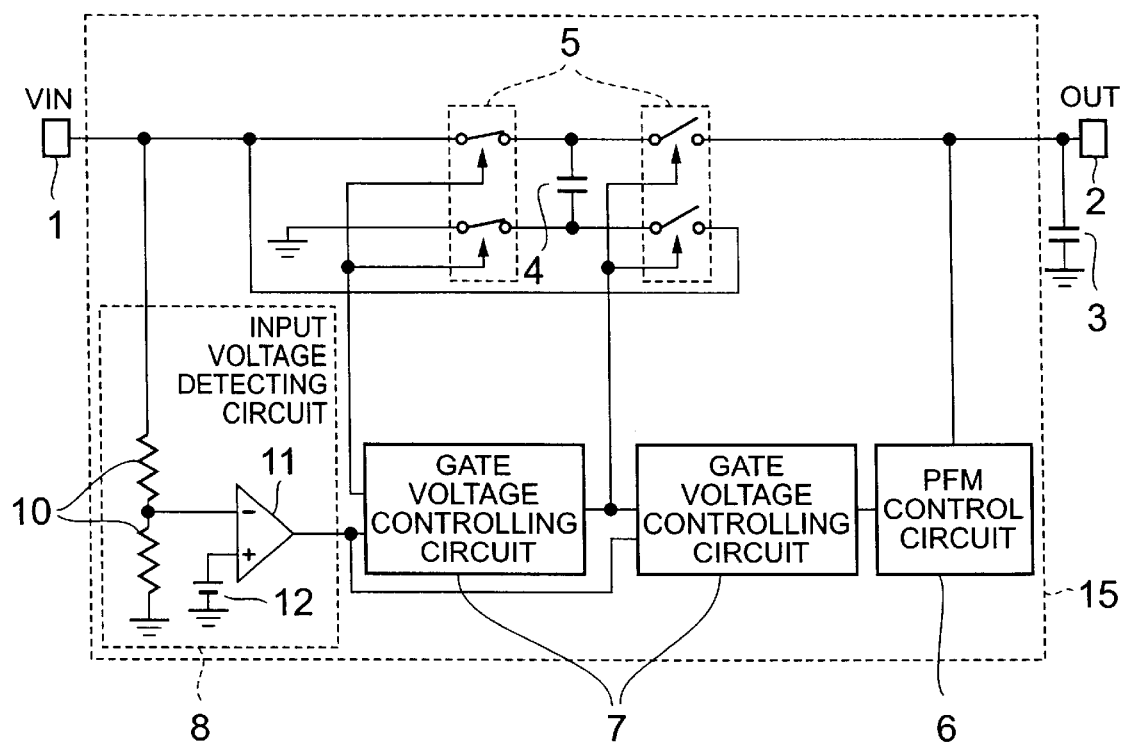
FIG. 3 is a circuit diagram, partly in block diagram, showing a configuration of a rush current limitation and noise reduction circuit for a PFM control charge pump according to another embodiment of the present invention.

FIG. 3 is a circuit diagram, partly in block diagram, showing a configuration of a rush current limitation and noise reduction circuit for a PFM control charge pump according to another embodiment of the present invention. Here, the rush current limitation and noise reduction circuit for a PFM control charge pump is constituted by a charge pump circuit 15 including driver circuits 5 and 5a for supplying the electric charges to a pump capacitor 4 and an output capacitor 3, respectively, gate voltage controlling circuits 7 and 7a for driving the driver circuits 5 and 5a, respectively, a PFM control circuit 6, and an input voltage detecting circuit 8 for detecting an input voltage having detection resistors 10, a comparator 11 and a reference voltage 12.

Next, the operation of the rush current limitation and noise reduction circuit for a PFM control charge pump according to another embodiment of the present invention will hereinbelow be described in detail with reference to FIG. 3. Upon activation of the charge pump circuit 15 provided by application of a high voltage to a power supply terminal 1, an input voltage is detected by the input voltage detecting circuit 8 for detecting a specific voltage on the basis of the comparison of the voltage obtained through the voltage division with the detection resistors 10 with the reference voltage 12 in the comparison 11 to be sent to each of the gate voltage controlling circuits 7 and 7a.

Figure 4:
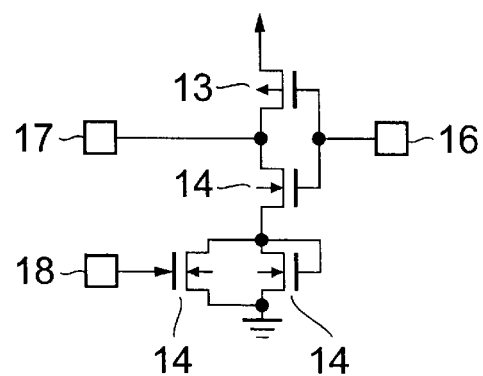
FIG. 4 is a circuit diagram showing a configuration of a concrete example of a gate voltage controlling circuit.

Here, an example of the gate voltage controlling circuit 7 or 7a is shown in FIG. 4. In FIG. 4, reference numeral 13 designates a P-channel MOS transistor, reference numeral 14 designates an N-channel MOS transistor, reference numeral 16 designates an input terminal of the gate voltage controlling circuit, reference numeral 17 designates an output terminal of the gate voltage controlling circuit, and reference numeral 18 designates an input voltage detection signal input terminal of the gate voltage controlling circuit.

As shown in the figure, the input terminal 16 is connected to a gate electrode which is held in common by the series-connected transistors 13 and 14, and the output terminal 17 is connected to a node between the transistors 13 and 14. Moreover, the two N-channel MOS transistors 14 are connected in parallel with each other between the above-mentioned transistor 14 and the GND terminal. Then, one of the parallel-connected transistors 14 has a gate terminal and a drain terminal connected to each other, and the other of the parallel-connected transistors 14 has a gate terminal connected to the input voltage detection signal input terminal 18. Note that a signal from the PFM control circuit is inputted to the input terminal 16 of the gate voltage controlling circuit, a signal used to control the gate voltage is outputted through the output terminal 17 of the gate voltage controlling circuit to each of the driver circuits 5 and 5a, and a signal from the input voltage detecting circuit 8 is inputted to the input voltage detection signal input terminal 18 of the gate voltage controlling circuit.

As a result, the adjustment is carried out so that the potential differences between the potentials appearing at the gate terminals of the switches of the respective driver circuits 5 and 5a and the potentials appearing at the source terminals on the power supply terminal 1 side and the GND terminal side of the respective switches become small, respectively. Thus, even when a high power supply voltage is applied to the power supply terminal 1, a large rush current is prevented from being caused to flow into the pump capacitor 4 or the output capacitor 3, and hence there is removed a possibility that other circuits undergo malfunction due to drop of the power supply voltage or generation of a noise. In addition, even during the normal operation, currents caused to flow through the driver circuits 5 and 5a are limited, whereby even when a high power supply voltage is applied, a large rush current is prevented from being caused to flow into the pump capacitor 4 or the output capacitor 3, and hence there is removed a possibility that other circuits undergo malfunction due to drop of the power supply voltage or generation of a noise.

Figure 5:
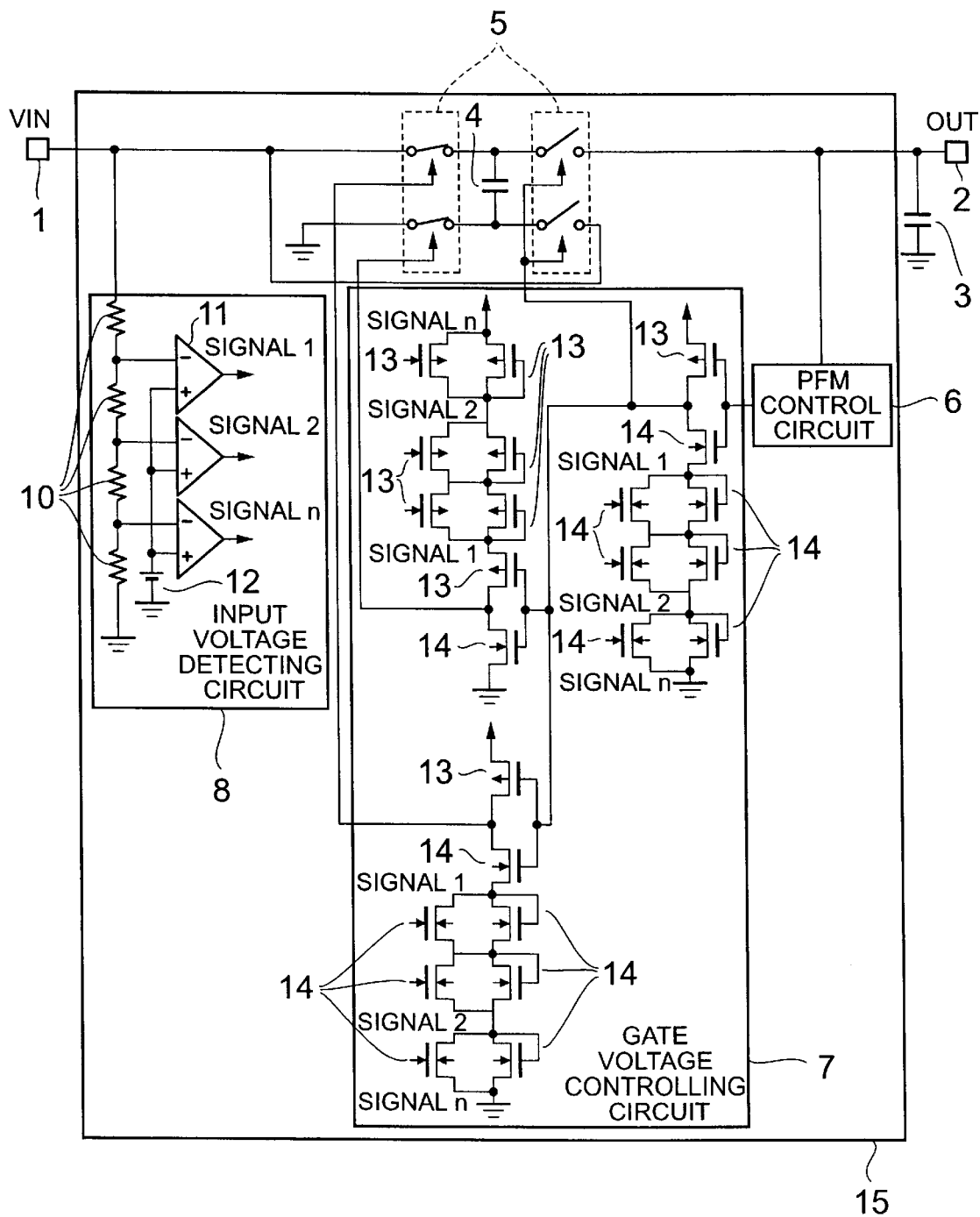
FIG. 5 is a circuit diagram, partly in block diagram, showing a configuration of a rush current limitation and noise reduction circuit for a PFM control charge pump according to still another embodiment of the present invention.

FIG. 5 is a circuit diagram, partly in block diagram, showing a configuration of a rush current limitation and noise reduction circuit for a PFM control charge pump according to still another embodiment of the present invention. Here, the rush current limitation and noise reduction circuit for a PFM control charge pump is constituted by a charge pump circuit 15 including driver circuits 5 and 5a for supplying the electric charges to a pump capacitor 4 and an output capacitor 3, respectively, gate voltage controlling circuits 7 and 7a adapted to drive the driver circuits 5 and 5a, respectively, and each having n P-channel MOS transistors 13 and n N-channel MOS transistors 14, a PFM control circuit 6 and an input voltage detecting circuit 8 adapted to detect an input voltage and having n detection resistors 10, n comparators 11 and a reference voltage 12. Note that a signal k outputted from the k-th ($1 \leq k \leq n$) comparator 11 of the input voltage circuit 8 is inputted to each of the k-th input voltage detecting circuits of the gate voltage controlling circuits 7 and 7a.

Next, the operation of the rush current limitation and noise reduction circuit for a PFM control charge pump according to the present embodiment will hereinbelow be described in detail with reference to FIG. 5. Upon activation of the charge pump circuit 15 provided by application of a high voltage to the power supply terminal 1, n input voltages are detected by the input voltage detecting circuit 8 for detecting n specific voltages on the basis of the comparison of the n voltages obtained through the voltage division with then detection resistors 10 with the reference voltage 12 in the n comparators 11 to output the detected n signals to each of the gate voltage controlling circuits 7 and 7a. Each of the gate voltage controlling circuits is configured so that the n P-channel MOS transistors 13 or the n N-channel MOS transistors 14 each having a gate terminal and a drain terminal connected to each other are connected to a source terminal of the P-channel MOS transistor 13 or the N-channel MOS transistor 14 of the pre-driver inverter circuit. The switch of the P-channel MOS transistor 13 or the N-channel MOS transistor 14 is connected in parallel with the n P-channel MOS transistors 13 or the n N-channel MOS transistors 14 each having the gate terminal and the drain terminal connected to each other, and the n signals from the input voltage detecting circuit 8 are sent to the gate terminals of the P-channel MOS transistors 13 or the N-channel MOS transistors 14, respectively, to make individually variable the voltages to be applied to the gate terminals for the specific power supply voltage. As a result, the adjustment is carried out so that the potential differences between the potentials appearing at the gate terminals of the switches of the respective driver circuits 5 and 5a and the potentials appearing at the source terminals on the power supply terminal 1 side and the GND terminal side of the respective switches become small, respectively, for the specific power supply voltages. Consequently, even when a high power supply voltage is applied to the power supply terminal 1, a large rush current is prevented from being caused to flow into the pump capacitor 4 or the output capacitor 3, and hence there is removed a possibility that other circuits undergo malfunction due to drop of the power supply voltage or generation of a noise.

In addition, even during the normal operation, currents caused to flow through the driver circuits 5 and 5a are limited for the specific voltage, whereby even when a high power supply voltage is applied to the power supply terminal 1, a large rush current is prevented from being caused to flow into the pump capacitor 4 or the output capacitor 3, and hence there is removed a possibility that other circuits undergo malfunction due to drop of the power supply voltage or generation of a noise.

As has been described above, the present invention has an effect of suppressing generation of a rush current and a noise, thereby preventing other circuits connected to the same input power supply as that of a PFM control charge pump circuit from undergoing malfunction.

As many apparently widely different embodiments of this invention may be made without departing from the spirit and scope thereof, it is to be understood that the invention is not limited to the specific embodiments thereof except as defined in the appended claims.

What is claimed is:

1. A rush current limiting circuit for a PFM control charge pump, comprising:
    an input voltage detecting circuit for detecting an input voltage through a power supply terminal;
    a driver circuit for supplying electric charges to a pump capacitor or an output capacitor; and
    a gate voltage controlling circuit for driving the driver circuit,
    wherein the driver circuit has a switch transistor for adjusting a quantity of electric charges supplied to the pump capacitor or the output capacitor, and
    the gate voltage controlling circuit, in response to a signal from the input voltage detecting circuit, outputs a signal used to make variable a gate voltage of the switch transistor of the driver circuit.

2. A rush current limiting circuit for a PFM control charge pump according to claim 1, wherein the input voltage detecting circuit includes detection resistors, a reference voltage and a comparator, and
    the input voltage detecting circuit detects the input voltage on the basis of a signal which the comparator compares a voltage value set through the detection resistors with the reference voltage to output.

3. A rush current limiting circuit for a PFM control charge pump according to claim 1, wherein in the gate voltage controlling circuit, n P-channel MOS transistors or N-channel MOS transistors each having a drain terminal and a gate terminal connected to each other are connected to a source terminal of a P-channel MOS transistor or an N-channel MOS transistor,
    n switch transistors for a pre-charge circuit are connected in parallel with the n P-channel or N-channel MOS transistors each having the drain terminal and the gate terminal connected to each other, and
    the n switch transistors for a pre-charge circuit are turned ON or OFF with n signals received from the input voltage detecting circuit to thereby control a gate voltage of the switch transistor of the driver circuit.

4. A rush current limiting circuit for a PFM control charge pump according to claim 2, wherein in the gate voltage controlling circuit, n P-channel MOS transistors or N-channel MOS transistors each having a drain terminal and a gate terminal connected to each other are connected to a source terminal of a P-channel MOS transistor or an N-channel MOS transistor,
    n switch transistors for a pre-charge circuit are connected in parallel with the n P-channel or N-channel MOS transistors each having the drain terminal and the gate terminal connected to each other, and
    the n switch transistors for a pre-charge circuit are turned ON or OFF with n signals received from the input voltage detecting circuit to thereby control a gate voltage of the switch transistor of the driver circuit.

\* \* \* \* \*